United States Patent [19]

Mehdizadeh et al.

[11] Patent Number: 4,918,388
[45] Date of Patent: Apr. 17, 1990

[54] QUADRATURE SURFACE COILS FOR MAGNETIC RESONANCE IMAGING

[75] Inventors: Mehrdad Mehdizadeh, University Hts.; David A. Molyneaux, Willoughby Hills; G. Neil Holland, Chagrin Falls, all of Ohio

[73] Assignee: Picker International, Inc., Highland Hts., Ohio

[21] Appl. No.: 234,278

[22] Filed: Aug. 19, 1988

Related U.S. Application Data

[63] Continuation-in-part of Ser. No. 199,202, May 26, 1988, Pat. No. 4,879,516, Ser. No. 120,475, Nov. 13, 1987, Pat. No. 4,839,594, and Ser. No. 86,277, Aug. 17, 1987, Pat. No. 4,841,248, which is a continuation-in-part of Ser. No. 931,726, Nov. 17, 1986, Pat. No. 4,752,738, and Ser. No. 765,708, Aug. 14, 1985, Pat. No. 4,793,356.

[51] Int. Cl.⁴ .................................. G01R 33/20
[52] U.S. Cl. ............................ 324/322; 128/653 R
[58] Field of Search ............... 324/307, 309, 318, 322; 335/299; 128/653; 336/228, 232

[56] References Cited

U.S. PATENT DOCUMENTS

| | | | |
|---|---|---|---|
| 4,297,637 | 10/1981 | Crooks et al. | 324/307 |
| 4,617,936 | 10/1986 | Malko | 128/653 |
| 4,620,155 | 10/1986 | Edelstein | 324/322 |
| 4,623,864 | 11/1986 | Inoue et al. | 335/299 |
| 4,636,730 | 1/1987 | Bottomley | 324/318 |
| 4,638,253 | 1/1987 | Jaskolski et al. | 324/322 |
| 4,680,549 | 7/1987 | Tanttu | 324/318 |
| 4,707,662 | 11/1987 | Kenner et al. | 324/318 |
| 4,712,069 | 12/1987 | Kemner et al. | 324/322 |
| 4,714,887 | 12/1987 | Meissner et al. | 324/322 |
| 4,718,431 | 1/1988 | Hartl et al. | 128/653 |
| 4,721,913 | 1/1988 | Hyde et al. | 324/318 |
| 4,725,779 | 2/1988 | Hyde et al. | 324/318 |
| 4,733,190 | 3/1988 | Dembinski | 324/318 |
| 4,734,647 | 3/1988 | Yoshimura | 324/318 |
| 4,739,269 | 4/1988 | Kopp | 324/318 |
| 4,746,866 | 5/1988 | Roschmann | 324/318 |
| 4,751,465 | 6/1988 | Zens | 324/322 |
| 4,752,736 | 6/1988 | Arakawa et al. | 324/318 |
| 4,816,765 | 3/1989 | Boskamp | 324/322 |
| 4,839,595 | 6/1989 | Boskamp | 324/318 |

Primary Examiner—Hezron E. Williams
Assistant Examiner—Kevin D. O'Shea
Attorney, Agent, or Firm—Fay, Sharpe, Beall, Fagan, Minnich & McKee

[57] ABSTRACT

A thin dielectric sheet (36) has a first or loop coil (30) defined on one surface thereof and a second or Helmholtz coil (32) defined on an obverse surface thereof. The dielectric sheet and associated coils may be laid flat (FIG. 3) or bent to match a selected curved surface of the subject (FIGS. 6-8). The first and second coils are arranged symmetrically about an axis or plane of symmetry (34). The first coil has an associated magnetic field along a y-axis and the second coil has an associated magnetic field along the x-axis. Circuits (40 and 42) tune the first and second magnetic resonance coils to a preselected magnetic resonance frequency. Magnetic resonance signals of the selected frequency received by one of the coils are phase shifted 90° by a phase shifting circuit (50) and combined with the unphase shifted signals from the other coil by a combining circuit (52). The combined signals are amplified (54) and conveyed to electronic image processing circuitry (E) of a magnetic resonance scanner.

17 Claims, 4 Drawing Sheets

QUADRATURE SURFACE COILS FOR MAGNETIC RESONANCE IMAGING

This application is a pending U.S. application Ser. No. 199,202 now U.S. Pat. No. 4,879,516, filed May 26, 1988; Ser. No. 120,475 now U.S. Pat. No. 4,839,594, filed Nov. 13, 1987; Ser. No. 086,277 now U.S. Pat. No. 4,841,248, filed Aug. 17, 1987; which are continuation-in-parts of Ser. No. 931,726, filed Nov. 17, 1986, now U.S. Pat. No. 4,752,738; and Ser. No. 765,708, filed Aug. 14, 1985 now U.S. Pat. No. 4,793,356.

BACKGROUND OF THE INVENTION

The present invention relates to the magnetic resonance arts. It finds particular application in conjunction with medical imaging and will be described with reference thereto. It is to be appreciated, however, that the invention may find further application in quality control inspections, spectroscopy, and the like.

Heretofore, linearly polarized magnetic resonance coils have been placed adjacent the surface of a patient to receive magnetic resonance signals therefrom. The linearly polarized coils receive only one component of magnetic resonance signals, commonly, the component in either the horizontal or vertical direction. By contrast, the magnetic resonance signals emanating from the subject are more accurately defined by a vector which rotates in a plane, i.e. has two orthogonal components. Thus, the linearly polarized coil only receives one of the two orthogonal components.

A quadrature coil, which has a circularly polarized magnetic field, receives back orthogonal components of the rotating vector. The quadrature coil extracts twice the signal power from the rotating vector than does the linearly polarized coil with the same noise. This results in a signal-to-noise ratio which is greater by the square root of two or about 41%. However, prior art quadrature coils have normally been volume coils rather than flat surface coils. For example, the volume quadrature coils have included two saddle coils which were rotated 90° relative to each other. The portion of the patient to be imaged was disposed within the volume defined in the interior of the saddle coils. Analogously, other coil designs were utilized which defined a volume around the circularly polarized region.

Others have recognized the desirability of a quadrature surface coil. See for example U.S. Pat. No. 4,721,913, issued Jan. 26, 1988 to Hyde, et al. However, the Hyde surface coil was relatively bulky and required accompanying complex electronic circuitry. The Hyde coil arrangement required relatively thick coils in the direction perpendicular to the subject. Positioning a coil of such bulk under a patient resting on a patient table caused considerable discomfort, as well as distorting the physiology of the adjoining body parts. Further, the Hyde coil was structurally complex, hard-to-align, and hard to fine tune. Moreover, because the Hyde coils were inductively coupled, they could not be actively decoupled from the transmit field requiring complex isolation circuitry.

In accordance with the present invention, a thin, quadrature surface coil is provided to overcome the above referenced problems and others.

SUMMARY OF THE INVENTION

In accordance with the present invention, a thin quadrature surface coil is provided. The plane of the surface coil may be flat for larger regions of a patient or may be bent around an axis of symmetry to conform to the surface of an anatomical portion of the patient.

In accordance with a more limited aspect of the present invention, the quadrature surface coil assembly includes a first coil and a second coil whose fields are generally perpendicular. The first and second thin coils are mounted parallel to each other and closely contiguous. In the preferred embodiment, the first and second coils are a loop coil that produces a vertical field and a Helmholtz or D-pair coil which produces a horizontal field.

In accordance with another more limited aspect of the present invention, the first and second coils are constructed of thin metal elements mounted to opposite sides of a thin planar insulator. In the preferred embodiment, the coils are constructed of foil mounted on opposite sides of a common circuit board.

In accordance with another aspect of the present invention, the quadrature coils are connected with electronic circuitry for decoupling the coils from a transmitted field. In accordance with a more limited aspect of the circuit invention, circuitry is provided for tuning and matching the coils. In accordance with another more limited aspect of the circuitry, a network is provided for phase shifting and combining signals while allowing reversal of the phase shift on site for proper quadrature operation.

In accordance with a yet more limited aspect of the present invention, the surface coil is contoured for conformity with the surface of a selected portion of the patient.

One advantage of the present invention is that it achieves quadrature detection with a thin coil assembly.

Another advantage of the present invention resides in the simplicity of the supporting detection circuitry.

Another advantage of the present invention is that the coil can be contoured to conform to the surface of selected anatomical portions.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components or in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
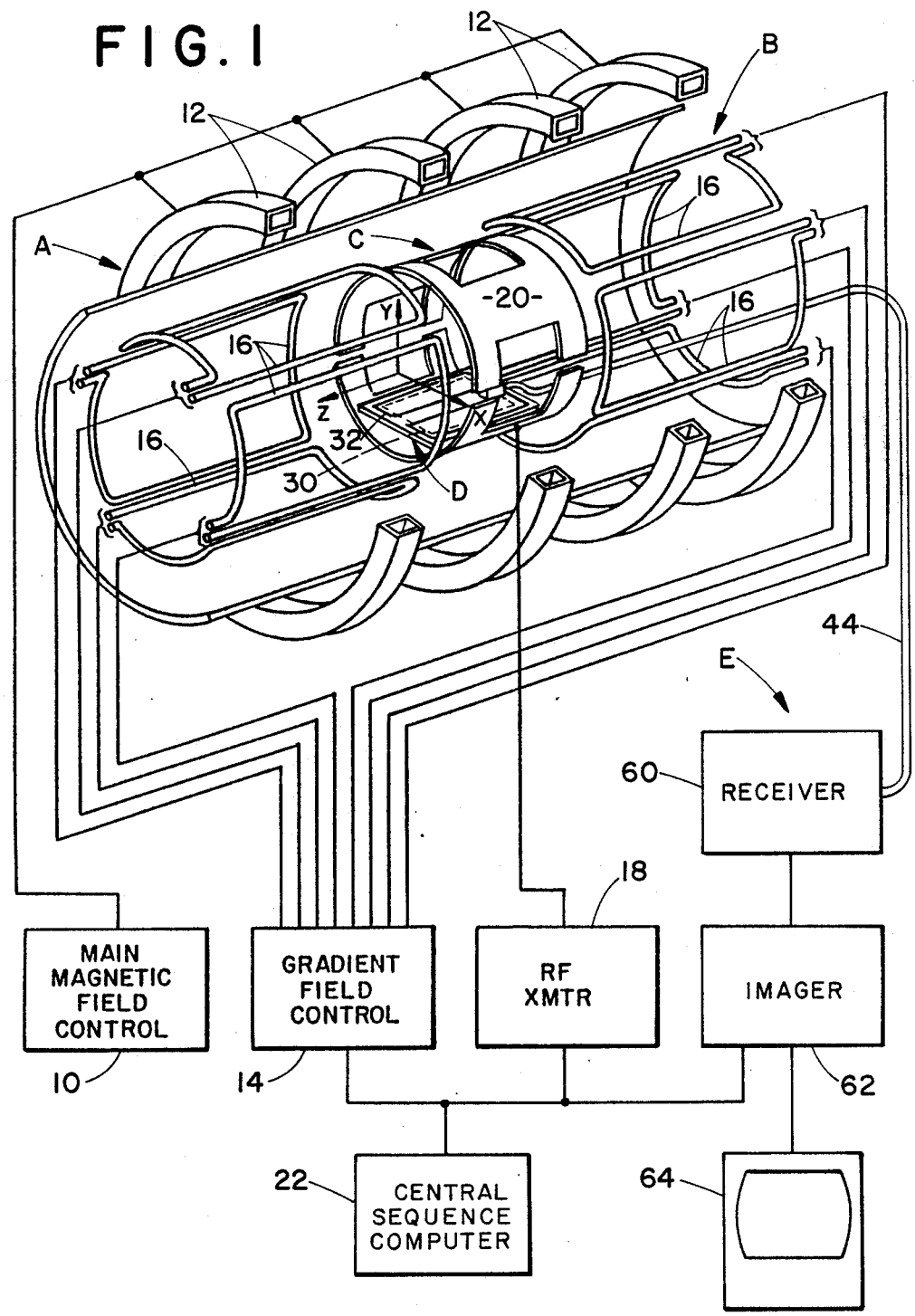
FIG. 1 is a diagrammatic illustration of a magnetic resonance image in accordance with the present invention.

With reference to FIG. 1, a magnetic resonance imaging apparatus includes a main magnetic field means A for establishing a generally static, main magnetic field longitudinally through an image region along a z-axis. A gradient field means B selectively produces magnetic field gradients transversely across the main magnetic field of the image region. A magnetic resonance excitation means C excites magnetic resonance in selected nuclei of a patient or subject disposed in the image region. The resonating nuclei generate radio frequency magnetic resonance signals which are received by a surface or localized coil D. More specifically, the surface coil is disposed adjacent a preselected region of the subject to be imaged such that it receives magnetic resonance signals from nuclei disposed in the preselected region of interest. Electronic processing circuitry E converts the received radio frequency signals into an image representation indicative of nuclei density, relaxation time, position, nuclei characteristics, or the like.

The main magnetic field means A includes a magnetic field control circuit 10 and a plurality of high power resistive or superconducting magnets 12. A gradient magnetic field control circuit or means 14 applies current pulses to gradient coils 16 to create gradients across the main magnetic field. The resonance excitation means C includes a radio frequency transmitter 18 and a transmission coil 20 to broadcast radio frequency (RF) signals that excite and manipulate magnetic resonance. Optionally, the localized coil D may be connected with the RF transmitter to apply the RF pulses to adjacent regions of the subject. A central computer 22 coordinates the sequence and timing of the gradient field and RF pulses as is conventional in the art.

The magnetic resonance signals emitted by the relaxation of nuclei in the subject have components only in a plane that is normal to the direction of the static, main magnetic field. For the coordinate system in which the z-axis extends along the main magnetic field, the magnetic resonance signals are within the x-y plane and generally circularly polarized.

Figure 2:
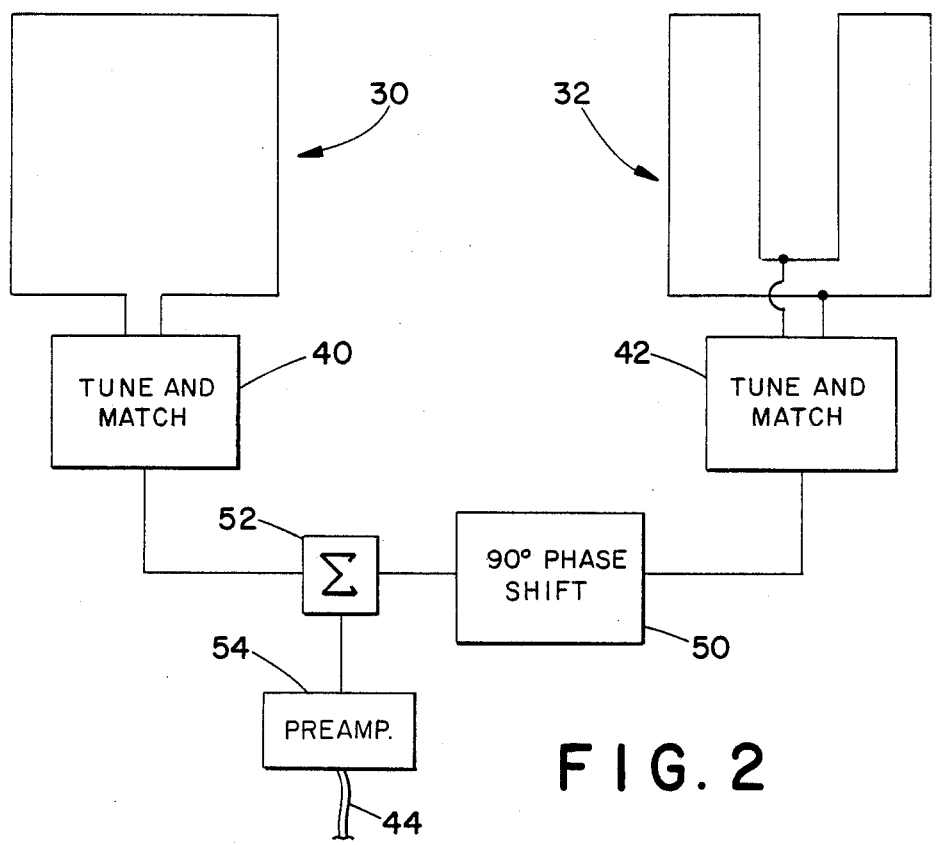
FIG. 2 is a diagrammatic illustration of the quadrature surface coil assembly in accordance with the present invention.

With continuing reference to FIG. 1 and further reference to FIG. 2, the localized coil D includes a first thin, preferably planar coil 30 which in a transmit mode would generate a magnetic field along a first axis and in a reception mode would be most receptive to magnetic field components along the first axis. In the illustrated embodiment, the first coil is rectangular or loop coil that is oriented to generate or receive fields along the y-axis. A second thin, preferably planar coil 32 transmits magnetic fields along and receives magnetic fields from a second axis different from the first axis. In the preferred embodiment, the second coil is a Helmholtz coil which generates magnetic fields along and receives magnetic resonance signals from along an x-axis. Alternately, double D coils may replace the Helmholtz coil, as may other coil combinations which are sensitive to magnetic fields in the coil.

Figure 3:
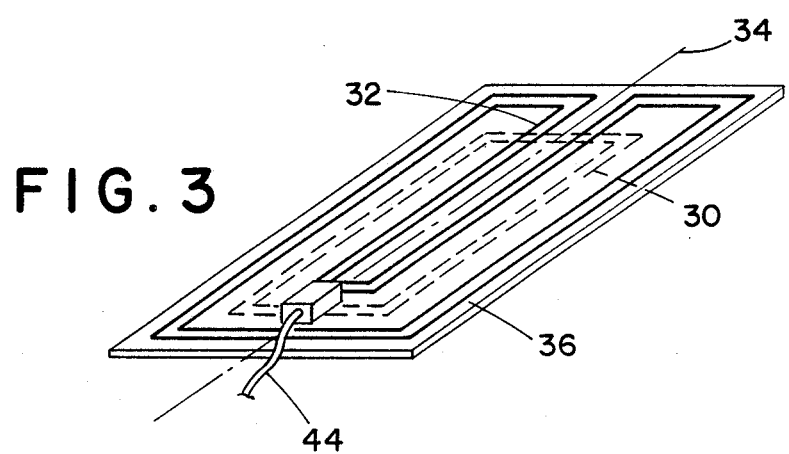
FIG. 3 illustrates placement of the coils on a flexible substrate.

With reference to FIG. 3, the first and second coils are generally coplanar. More specifically to the preferred embodiment, the loop and Helmholtz coils are etched symmetrically about a common axis 34 of symmetry in metal foil on opposite faces of an insulator, e.g. etched in opposite faces of a dual faced circuit board 36. The coils are not directly opposite each other across the board to minimize capacitive coupling. In the preferred embodiment, coil 30 is shorter and about 50% as wide as coil 32. This symmetry creates a condition of zero mutual coupling between the coils for proper quadrature operation. By placing the axis of symmetry 34 along the main magnetic field, the magnetic fields associated with the first and second coils are orthogonal to the region of interest and disposed along the x-y plane to create a circularly polarized field.

The insulating material may be flexible to contour the smooth thin surface of the first and second coils to the surface of the patient. Analogously, the insulator may be rigid to hold the coils in a flat plane or a smooth surface which extends along a selected contour. In this manner, both coils lie in parallel contiguous planes or surfaces. Because the insulating sheet 34 is very thin, the two coils are essentially coplanar. The circuit board is preferably a thin TEFLON (TEFLON is a registered trademark of I. E. Dupont De Nemours for polytetrafluoroethylene) PC board.

The first coil is connected with a first matching and decoupling circuit 40 and the second coil is connected with a second matching and decoupling coil circuit 42. The matching and decoupling circuits resonate the coils at a selected operating frequency and match the output to a cable 44 for conveying the signals to the processing circuitry E, e.g. a 50 ohm cable. The matching and decoupling circuits also electronically decouple or deresonate the coils during a transmit pulse to prevent distortion of the transmitted RF field and possible overloading or other damage to the processing circuitry E. A 90° phase shift circuit 50 delays the signals from a selectable one of the coils by 90° such that signals are coincident when they are combined by a combining means or circuit 52. A preamplifier 54 amplifies the signals and transmits them along the cable 44.

The processing circuitry includes a receiver 60 which receives the magnetic resonance signals. An imager 62 reconstructs image representations from the received magnetic resonance signals for display on a video monitor 64, further processing, storage, or the like.

Figure 4:
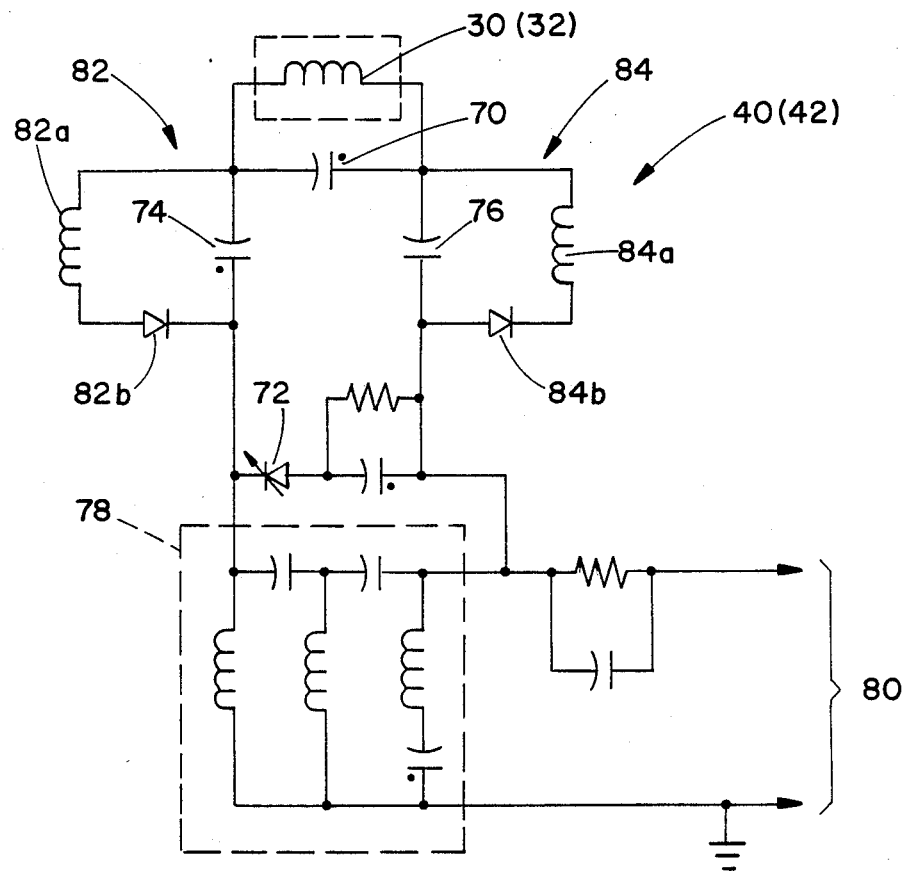
FIG. 4 is a detailed illustration of matching, tuning, and decoupling circuitry of FIG. 1.

With reference to FIG. 4, the matching and decoupling circuits 40 and 42 are of the same construction. Accordingly, circuit 40 will be described in detail and it is to be appreciated that the description applies by analogy to circuit 42. The associated coil 30 or 32 is tuned by a capacitor 70 and a varactor or voltage tuned capacitor 72 to the selected frequency. The capacitances 70 and 72 as well as capacitors 74 and 76 match the coil to 200 ohms during the reception of magnetic resonance signals. A transform balun 78 matches the 200 ohms to a 50 ohm output 80. The varactor 72 is tuned or biased by a tuning voltage applied at output 80.

During the transmit pulse, parallel resonant circuits 82, 84 have a high impedance and create an isolation between coil 30 and the output 80 to protect the preamplifier 54. Inductors 82a and 84a are chosen such that they resonate with the capacitors 74 and 76 at the selected operating frequency. PIN diodes 82b, 84b are forward biased during transmission to cause a large impedance appears across the coil 30 which prevents currents induced by the transmit field from flowing in the coil and distorting the transmit field.

Figure 5:
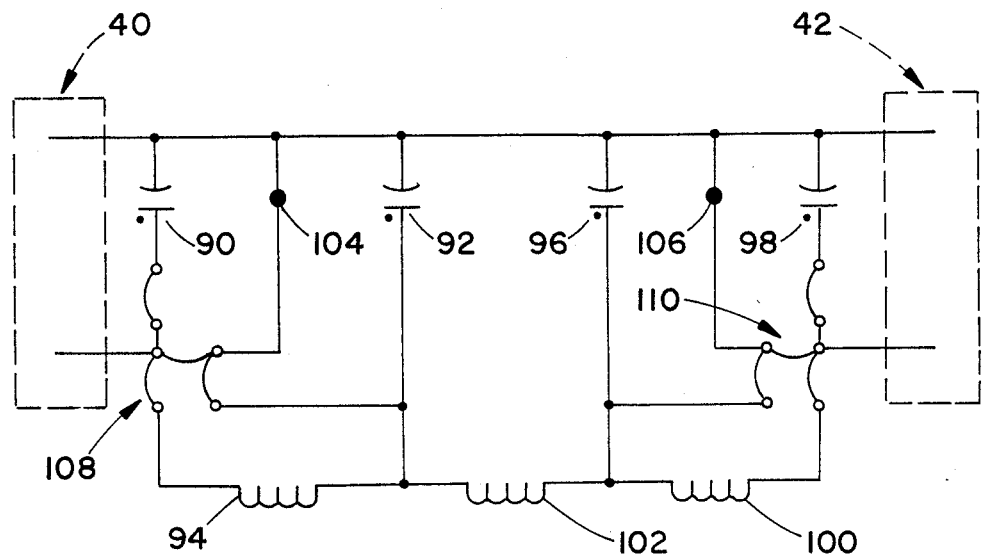
FIG. 5 is a detailed description of the phase shifting and combining networks of FIG. 2.

With reference to FIG. 5, the phase shift and combining circuits 50, 52 receive signals from the matching and tuning circuits 80 associated with coil assemblies 30 and 32. Capacitors 90 and 92 and inductor 94 phase shift the received signal from circuit 40 by 90° at the operating frequency. Analogously, capacitors 96 and 98 and inductor 100 cause a 90° phase shift in the signal from circuit 42 at the operating frequency. Inductors 94 and 102 and capacitor 92 can combine the two signals into a first 50 ohm port 104. Analogously, inductors 100 and 102 and capacitor 96 can combine the signals into a second 50 ohm port 106. First and second switching or jumper lead assemblies 108 and 110 are selectively set to select whether the signal for circuit 40 or from circuit 42 is shifted by 90°. This allows a choice of outputs depending on the direction of the main static magnetic field. Moreover, this arrangement enables two separate coil outputs to be provided for purposes of set up and measurement of isolation between the two coils and during the tuning of each coil.

Although the flat coil of FIG. 3 is ideally suited for imaging the lumbar spine and other anatomical regions for which a relatively flat geometry is suitable, other coil combinations may be provided which follow the contour of the subject.

Figure 6:
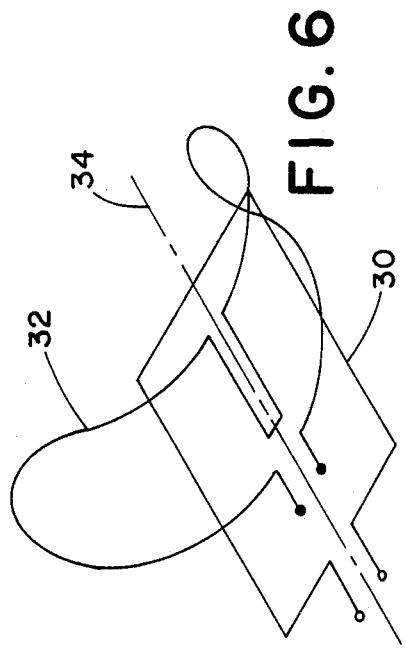
FIG. 6 illustrates an alternate embodiment in which the quadrature coil is contoured for cervical spine studies.

With reference to FIG. 6, the Helmholtz pair is curved to follow the contour of a patient's neck. The loop coil is generally flat. The coils are symmetric about axis 62. In this embodiment, good field penetration is gained for neck studies as well as quadrature gain. Other coil configurations that are curved or bent about the axis of symmetry 34 are also contemplated.

Figure 7:
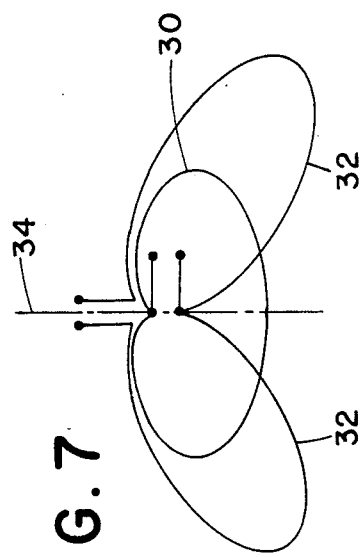
FIG. 7 is another alternate embodiment in which the Helmholtz coil pair are curved to conform to the patient for orbital exams.

With reference to FIG. 7, the loop coil 30 is generally circular to circumscribe a patient's orbit. A curved Helmholtz pair 32 are arranged symmetrically to axis 34 but curved or canted by about 45° to follow the contour of the patient's skull adjacent the orbit.

Figure 8:
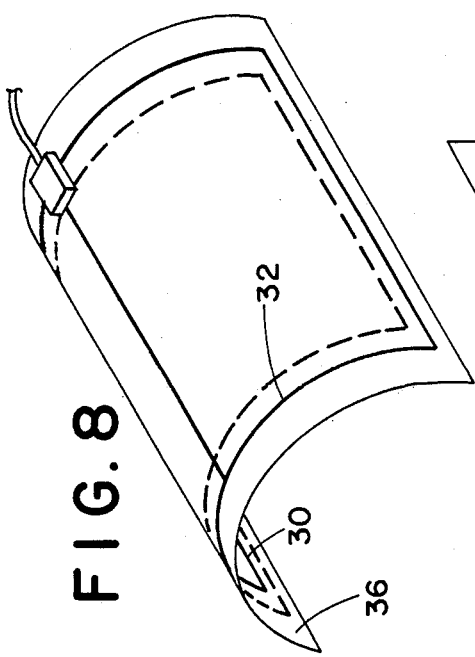
FIG. 8 is another alternate embodiment in which a double-D coil pair and loop coil is contoured to conform with a torso section of the patient; and, FIG. 9 is another quadrature Helmholtz and loop coil combination.

An analogous larger coil can be configured for imaging sections of the torso as illustrated in FIG. 8. The first coil loop 30 follows a generally semi-circular or semi-elliptical plane. A D-pair coil 32 is larger than coil 30 but follows the same semi-circular or elliptical plane.

Figure 9:
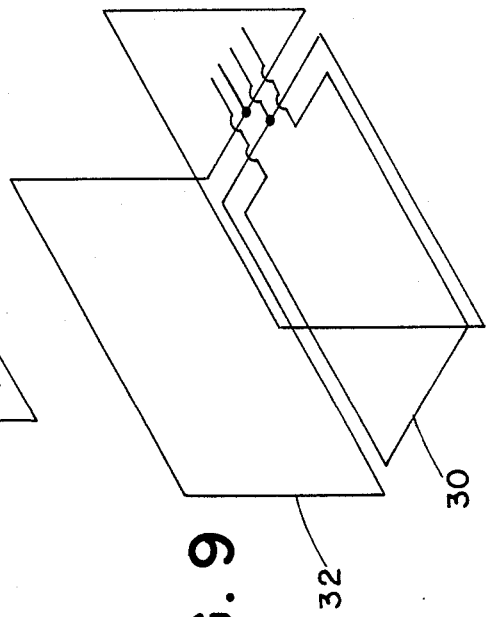

In FIG. 9, the Helmholtz coil is again bent for better field penetration.

The invention has been described with reference to the preferred embodiments. Obviously, modifications and alterations will occur to others upon reading and understanding the preceding specification. It is intended that the invention be construed as including all such alterations and modifications insofar as they come within the appended claims or the equivalents thereof.

Having thus described the preferred embodiment, the invention is now claimed to be:

1. A magnetic resonance imaging apparatus comprising:
   a main magnetic field means for providing a magnetic field through an examination region;
   a magnetic resonance excitation means for exciting magnetic resonance of nuclei of a subject in the examination region;
   a thin quadrature coil for quadrature detecting magnetic resonance signals from the excited nuclei of the subject including:
   a thin dielectric layer;
   a thin loop coil fixedly mounted on one surface of the thin dielectric layer;
   a thin Helmholtz coil fixedly mounted on an obverse surface of the thin dielectric layer; and,
   processing means for processing the quadrature detected magnetic resonance signals into an image representation.

2. The apparatus as set forth in claim 1 wherein the loop coil has an associated magnetic field along a first axis; and,
   the Helmholtz coil has an associated magnetic field along a second axis, the loop and Helmholtz coils being disposed along generally parallel surfaces and the first and second axes being generally orthogonal.

3. The apparatus as set forth in claim 1 wherein the thin dielectric layer is curved to conform to a surface portion of the subject.

4. The apparatus as set forth in claim 2 wherein the loop and Helmholtz coils are symmetric about a common axis of symmetry.

5. A magnetic resonance imaging apparatus comprising:
   a main magnetic field means for providing a magnetic field through an examination region;
   a magnetic resonance excitation means for exciting magnetic resonance of nuclei of a subject in the examination region;
   first and second coils lying on parallel surfaces for quadrature detecting magnetic resonance signals from the excited nuclei of the subject, the first coil being a loop coil and the second coil being a Helmholtz pair coil; and,
   processing means for processing the quadrature detected magnetic resonance signals into an image representation.

6. A flat coil assembly for quadrature detecting magnetic resonance signals, the coil assembly comprising:
   a first coil disposed along a first plane with its associated magnetic field generally transverse to the first plane; and,
   a Helmholtz coil disposed along a second plane, the first and second planes being disposed parallel and contiguous to each other, the Helmholtz coil having an associated magnetic field that lies substantially orthogonal to the first magnetic fields, such that the first and second coils quadrature detect magnetic resonance signals.

7. The coil assembly as set forth in claim 6 wherein the first and second coils are symmetric about a plane of symmetry which is perpendicular to the first and second planes.

8. The coil assembly as set forth in claim 7 wherein the first coil is a loop coil.

9. A quadrature coil assembly comprising:
   a dielectric sheet;
   a first coil having an associated magnetic field along a first axis, the first coil being mounted to the dielectric sheet; and,
   a Helmholtz coil having an associated magnetic filed along a second axis, the second coil being mounted to the dielectric sheet and the second axis being substantially orthogonal to the first axis for quadrature coil operation.

10. The coil assembly as set forth in claim 9 wherein the dielectric sheet is curved to conform to a surface portion of an object being examined.

11. The coil assembly as set forth in claim 9 wherein the first and Helmholtz coils are mounted to opposite faces of the dielectric sheet.

12. The coil assembly as set forth in claim 11 wherein the first and Helmholtz coils are constructed of thin foil.

13. A coil assembly comprising:
a first coil having an associated magnetic field along a first axis;
a second coil having an associated magnetic field along a second axis, the first and second coils being mounted closely adjacent and such that the first and second axes are substantially orthogonal;
a phase shift circuit operatively connected with one of the first and second coils for phase shifting received signals by 90°;
a combining means for combining the phase shifted signal from one coil with the signal from the other coil;
a cable for connecting the combining means with a radio frequency receiver; and,
a matching means for matching the impedance of the cable.

14. A coil assembly comprising:
a first coil associated with a magnetic field along a first axis;
a second coil associated with a magnetic field along a second axis, the first and second coils being tuned to a preselected magnetic resonance frequency the first and second coils being mounted closely adjacent and such that the first and second axes are substantially orthogonal;
a decoupling means for selectively detuning the first and second coils from the preselected magnetic resonance frequency
a phase shift circuit operatively connected with one of the first and second coils for phase shifting received signals by 90°; and,
a combining mean for combining the phase shifted signal from one coil with the signal from other coil.

15. A coil assembly comprising:
a first coil associated with a magnetic field along a first axis;
a second coil associated with a magnetic field along a second axis, the first and second coils being mounted closely adjacent and such that the first and second axes are substantially orthogonal;
a first phase shifting circuit associated with the first coil for phase shifting received signals by 90°;
a second 90° phase shifting circuit associated with the second coil;
a combining means for combining the phase shifted signal from one coil with the signal from the other coil; and,
a switching means for selectively switching one of the 90° phase shift circuits between its associated coil and the combining means for connecting the other coil directly with the combining means.

16. A coil assembly comprising:
a first coil associated with a magnetic field along a first axis;
a second coil extending in generally a semi-ellipse and associated with a magnetic field along a second axis, the first and second coils being mounted closely adjacent and such that the first and second axes are substantially orthogonal, whereby the coil assembly is contoured generally in accordance with a patient's neck;
a phase shift circuit operatively connected with one of the first and second coils for phase shifting received signals by 90°; and,
a combining means for combining the phase shifted signal from one coil with the signal from the other coil.

17. A coil assembly comprising:
a first coil associated with a magnetic field along a first axis;
a second coil associated with a magnetic field along a second axis, the second coil includes two coil portions which are disposed at generally at 45° angle relative to each other, the first and second coils being mounted closely adjacent and such that the first and second axes are substantially orthogonal;
a phase shift circuit operatively connected with one of the first and second coils for phase shifting received signals by 90°; and,
a combining means for combining the phase shifted signal from one coil with the signal from the other coil.

* * * * *